(12) United States Patent
Drescher et al.

(10) Patent No.: US 10,593,590 B2
(45) Date of Patent: Mar. 17, 2020

(54) COMBINED WAFER PRODUCTION METHOD WITH LASER TREATMENT AND TEMPERATURE-INDUCED STRESSES

(71) Applicant: Siltectra GmbH, Dresden (DE)

(72) Inventors: Wolfram Drescher, Dresden (DE); Jan Richter, Dresden (DE); Christian Beyer, Freiberg (DE)

(73) Assignee: Siltectra GmbH, Dresden (DE)

( * ) Notice: Subject to any disclaimer, the term of this patent is extended or adjusted under 35 U.S.C. 154(b) by 0 days.

(21) Appl. No.: 16/378,902

(22) Filed: Apr. 9, 2019

(65) Prior Publication Data
US 2019/0237359 A1 Aug. 1, 2019

Related U.S. Application Data

(63) Continuation of application No. 15/028,332, filed as application No. PCT/EP2014/071512 on Oct. 8, 2014, now Pat. No. 10,312,135.

(30) Foreign Application Priority Data

Oct. 8, 2013 (DE) .......... 10 2013 016 666
Sep. 3, 2014 (DE) .......... 10 2014 013 107

(51) Int. Cl.
*H01L 21/30* (2006.01)
*H01L 21/762* (2006.01)
(Continued)

(52) U.S. Cl.
CPC .... *H01L 21/76259* (2013.01); *B23K 26/0624* (2015.10); *B23K 26/359* (2015.10);
(Continued)

(58) Field of Classification Search
CPC .......... H01L 23/562; H01L 23/544; H01L 21/02002; H01L 21/268; H01L 31/1896;
(Continued)

(56) References Cited

U.S. PATENT DOCUMENTS 6,248,649 B1 * 6/2001 Henley .......... H01L 21/67092
257/E21.568
6,886,008 B2 4/2005 Blayvas
(Continued)

FOREIGN PATENT DOCUMENTS

CN 101996943 3/2011
DE 19640594 4/1998
(Continued)

OTHER PUBLICATIONS

Bruel M et al: 11 Smart cut: a promising 1-3.7,13 new SOI material technology 11, SOI Conference, 1995. Proceedings., 1995 IEEE International Tucson, AZ, USA Oct. 3-5, 1995, New York, NY, USA,IEEE, us.
(Continued)

*Primary Examiner* — Shouxiang Hu
(74) *Attorney, Agent, or Firm* — Murphy, Bilak & Homiller, PLLC (57) ABSTRACT

A method for the production of layers of solid material is contemplated. The method may include the steps of providing a solid body for the separation of at least one layer of solid material, generating defects by means of at least one radiation source, in particular a laser, in the inner structure of the solid body in order to determine a detachment plane along which the layer of solid material is separated from the solid body, and applying heat to a polymer layer disposed on the solid body in order to generate, in particular mechanically, stresses in the solid body, due to the stresses a crack propagating in the solid body along the detachment plane, which crack separates the layer of solid material from the solid body.

15 Claims, 3 Drawing Sheets

(51) Int. Cl.
  *B23K 26/359*  (2014.01)
  *H01L 31/18*  (2006.01)
  *B28D 5/00*  (2006.01)
  *H01L 21/268*  (2006.01)
  *B23K 26/40*  (2014.01)
  *H01L 21/02*  (2006.01)
  *B23K 26/53*  (2014.01)
  *B23K 26/0622*  (2014.01)
  *H01L 23/544*  (2006.01)
  *H01L 23/00*  (2006.01)
  *B23K 26/00*  (2014.01)
  *C30B 33/06*  (2006.01)
  *B23K 103/00*  (2006.01)

(52) U.S. Cl.
  CPC .............. *B23K 26/40* (2013.01); *B23K 26/53* (2015.10); *B28D 5/0005* (2013.01); *B28D 5/0011* (2013.01); *H01L 21/02002* (2013.01); *H01L 21/268* (2013.01); *H01L 21/76254* (2013.01); *H01L 23/544* (2013.01); *H01L 23/562* (2013.01); *H01L 31/1892* (2013.01); *H01L 31/1896* (2013.01); *B23K 26/0006* (2013.01); *B23K 2103/50* (2018.08); *B23K 2103/56* (2018.08); *C30B 33/06* (2013.01); *H01L 2223/5446* (2013.01); *Y02E 10/50* (2013.01)

(58) Field of Classification Search
  CPC ....... H01L 2223/5446; H01L 21/76254; H01L 31/1892; H01L 21/76259; H01L 21/823842; H01L 21/28088; H01L 21/265; H01L 21/28008; H01L 21/266; H01L 21/823828; H01L 21/823431; H01L 21/82345
  See application file for complete search history.

(56) References Cited

U.S. PATENT DOCUMENTS

| | | | |
|---|---|---|---|
| 7,052,978 B2 | 5/2006 | Shaheen et al. | |
| 8,021,963 B2* | 9/2011 | Sekiya | H01L 21/268 |
| | | | 438/459 |
| 8,053,331 B2* | 11/2011 | Gadkaree | H01L 21/76251 |
| | | | 257/E21.568 |
| 8,440,129 B2 | 5/2013 | Lichtensteiger et al. | |
| 2001/0028390 A1 | 10/2001 | Hayashi | |
| 2005/0048738 A1 | 3/2005 | Shaheen | |
| 2005/0181210 A1 | 8/2005 | Doering | |
| 2008/0012140 A1 | 1/2008 | Tsukano | |
| 2009/0056513 A1 | 3/2009 | Baer | |
| 2010/0009549 A1 | 1/2010 | Sekiya | |
| 2012/0121906 A1 | 5/2012 | Hougham | |
| 2013/0089969 A1 | 4/2013 | Wagner | |

FOREIGN PATENT DOCUMENTS

| | | |
|---|---|---|
| EP | 1338371 | 8/2003 |
| EP | 1494271 | 1/2005 |
| EP | 1498215 | 1/2005 |
| EP | 2390044 | 11/2011 |
| EP | 2426697 | 7/2012 |
| JP | 2006245498 | 9/2006 |
| JP | 2010247189 A | 11/2010 |
| JP | 2011505684 | 2/2011 |
| JP | 2012169361 A | 9/2012 |
| TW | 200933703 | 8/2009 |
| WO | 2009/061353 | 5/2009 |
| WO | 2010072675 | 7/2010 |
| WO | 2013/26927 | 8/2013 |

OTHER PUBLICATIONS

International Search Report of corresponding PCT/EP2014/071512.
International Preliminary Report on Patentability of corresponding PCT/EP2014/071512.
Analysis of internal crack propagation in silicon due to permeable pulse laser irradiation: study on processing mechanism of stealth dicing Authors: Ohmura Etsuji, Kawahito Yuta, Fukumitsu Kenshi, Okuma Junji, Morita Hideki Publication data: Fundamentals of Laser-Assisted Micro- and Nanotechnologies 2010,,Jul. 22, 2010,SPIE, 1000 20th St. Bellingham WA 98225-6705 USA.
- Ohmura et. al. (Journal of Achievements in Materials and Manufacturing Engineering, 2006, vol. 17p. 381 ff).
XP-002755956.

* cited by examiner

COMBINED WAFER PRODUCTION METHOD WITH LASER TREATMENT AND TEMPERATURE-INDUCED STRESSES

The present invention relates to a method for the production of layers of solid material according to the subject matter of Claim 1 and to a wafer produced by this method (Claim 13).

In many technical domains (e.g. microelectronic or photovoltaic technology) materials, such as e.g. silicon, germanium or sapphire, are often needed in the form of thin discs and plates (so-called wafers). As standard, such wafers are currently produced by sawing from an ingot, relatively large material losses ("kerf loss") occurring. Since the source material used is often very expensive, great efforts are being made to produce such wafers with less material consumption and so more efficiently and inexpensively.

For example, with the currently normal methods almost 50% of the material used is lost as "kerf loss" when producing silicon wafers for solar cells alone. Considered globally, this corresponds to an annual loss of more than 2 billion euros. Since the cost of the wafer makes up the greatest percentage of the cost of the finished solar cell (over 40%), the cost of solar cells could be significantly reduced by making appropriate improvements to the wafer production.

Methods which dispense with the conventional sawing and can separate thin wafers directly from a thicker workpiece, e.g. by using temperature-induced stresses, appear to be particularly attractive for this type of wafer production without kerf loss ("kerf-free wafering"). These include in particular methods as described e.g. in PCT/US2008/012140 and PCT/EP2009/067539 where a polymer layer applied to the workpiece is used in order to produce these stresses.

In the aforementioned methods the polymer layer has a thermal expansion coefficient that is higher by approximately two orders of magnitude in comparison to the workpiece. Moreover, by utilising a glass transition a relatively high elasticity modulus can be achieved in the polymer layer so that sufficiently large stresses can be induced in the polymer layer workpiece layer system by cooling in order to enable the separation of the wafer from the workpiece.

Upon separating a wafer from the workpiece, in the aforementioned methods polymer still adheres to a respective side of the wafer. The wafer bends here very strongly towards this polymer layer, and this makes it difficult to execute the separation in a controlled manner, and may lead e.g. to variations in the thickness of the separated wafer. Moreover, the strong curvature makes subsequent processing difficult and may even lead to the wafer shattering.

When using the methods according to the previous prior art, the wafers produced generally have respectively larger thickness variations, the spatial thickness distribution often showing a pattern with four-fold symmetry. The total thickness variation seen over the entire wafer ("total thickness variation", TTV) is often more than 100% of the average wafer thickness when using the previous methods (a wafer with an average thickness of, for example, 100 micrometres, that is e.g. 50 micrometres thick at its thinnest point and 170 micrometres thick at its thickest point, has a TTV of 170−50=120 micrometres, which corresponds to a total thickness variation of 120% relative to its average thickness). Wafers with these strong thickness variations are unsuitable for many applications. Moreover, with the most frequently occurring four-fold thickness distribution patterns, the regions with the greatest variations unfortunately lie in the middle of the wafer where they cause the greatest disruption.

Moreover, in the method according to the current prior art, undesirable oscillations in the layer systems involved occur during the break propagation upon separation, and these oscillations have a negative impact upon the development of the break front and may in particular lead to significant thickness variations of the separated wafer.

In addition, with the previous methods it is difficult to ensure reproducibly good heat contact over the entire surface of the polymer layer. Locally insufficient heat contact may, however, lead to undesirable significant local temperature variations in the layer system due to the low thermal conductivity of the polymers used, and this on its part has a negative impact upon the controllability of the stress fields produced and so upon the quality of the wafers produced.

Furthermore, a method for the separation of semiconductor materials by means of light-induced boundary surface decomposition and apparatuses produced in this way, such as structured and free-standing semiconductor layers and components, is known from publication DE 196 40 594 A1. The method according to DE 196 40 594 A1 includes the illumination of boundary surfaces between the substrate and the semiconductor layer or between semiconductor layers, by means of which the light absorption on the boundary surface or in an absorption layer provided for this purpose leads to material decomposition. The choice of boundary surface or semiconductor layer which can be caused to decompose is made by choosing the light wavelength and the light intensity, the irradiation direction or the insertion of a thin sacrificial layer during the material production. The disadvantage of this method is that high doses of energy have to be used in order to destroy whole layers, due to which the energy requirement, and so the costs of the process are very high.

Furthermore, publications EP000002390044B1, EP00000149821561, EP000001494271B1 and EP000001338371B1 disclose a method in which the laser is used for the vertical separation of workpieces.

Furthermore, laser-supported methods for generating areas of damage within a wafer are known. With a focussed laser multiphoton excitations are thereby achieved at depth, by means of which it is possible to cause damage at depth without causing damage upon material entry.

Typically, lasers with an ns pulse duration (nanosecond pulse duration) are used here so that a strong interaction of the heated material and the laser can occur. Typically, this happens by means of a photon/photon interaction which has a clearly higher absorption than the multi-photon excitation.

This type of method is known, for example, from Ohmura et. al. (Journal of Achievements in Materials and Manufacturing Engineering, 2006, vol 17, p. 381 ff). The wafer treatment proposed by Ohmura et al. serves to generate crack directing lines by generating defects within the wafer, as can be partially provided by isolating wafer elements of a wafer plate. The defects generated by this method extend in a vertical direction here, by means of which the connection structure between the individual wafer elements is subjected to longitudinal weakenings at right angles to the main surface of the wafer elements. These longitudinal weakenings have extensions of >50 μm.

The advantage utilised in order to isolate wafer elements, namely the generation of extensions with a vertical extension of >50 μm prevents the application of this type of defect generation to methods for the splitting off of one or more wafer layers from a solid body. On the one hand, with the generation of these longitudinal defects distributed over the wafer surface, a material layer is produced within the solid body which can only be used to direct cracks, but is unsuitable for subsequent use, and so constitutes waste. On the other hand, this waste must be removed, e.g. by a polishing process, by means of which there would be additional cost. It is therefore the object of the present invention to provide a method for the production of layers of solid material or solid bodies that enables the inexpensive production of solid plates or uneven solid bodies with a desired thickness distribution, the vertical damage being minimised by the crack plane.

It is therefore the object of the present invention to provide a method for the production of layers of solid material that enables the inexpensive production of solid plates or wafers with an even thickness, in particular with a TTV of less than 120 micrometres. According to another aspect of the present invention the object is to provide a method for the production of one or more layers of solid material in which a crack propagation plane is generated by means of a laser within a solid body, the individual defects forming the crack propagation plane having a vertical extension of less than 50 µm.

The aforementioned object is achieved by a method according to claim 1 for the production of layers of solid material. This method preferably comprises at least the steps of providing a workpiece or a solid body for the separation of at least one layer of solid material, generating defects by means of at least one radiation source, in particular a laser, in particular an fs laser or femtosecond laser, in the inner structure of the solid body in order to determine a detachment plane along which the layer of solid material is separated from the solid body, providing a receiving layer for holding the layer of solid material on the solid body, applying heat to the receiving layer in order to generate, in particular mechanically, stresses in the solid body, due to the stresses a crack propagating in the solid body along the detachment plane, which crack separates the layer of solid material from the solid body.

This solution is advantageous because by virtue of the radiation source the detachment layer or defect layer can be generated in the solid body by means of which the crack is managed or directed during the crack propagation, and this makes it possible to produce very small TTVs, in particular smaller than 200 micrometres or 100 micrometres or smaller than 80 micrometres or smaller than 60 micrometres or smaller than 40 micrometres or smaller than 20 micrometres or smaller than 10 micrometres or smaller than 5 micrometres, in particular 4, 3, 2, 1 micrometres. Exposing the wafer to rays thus creates in a first step a type of perforation within the solid body along which, in a second step, the crack propagation takes place or along which the layer of solid material is separated from the solid body.

Additional advantageous embodiments are the subject matter of the following description and/or the sub-claims.

According to one preferred embodiment of the present invention the laser has a pulse duration of less than 10 ps, particularly preferably of less than 1 ps and at best of less than 500 fs.

According to one preferred embodiment of the present invention the stresses for detaching the layer of solid material are generated by the solid body by applying heat to the receiving layer, in particular a polymer layer. The application of heat preferably constitutes cooling of the receiving layer or polymer layer at or below ambient temperature and preferably below 10° C. and particularly preferably below 0° C. and more preferably below −10° C. Extremely preferably the cooling of the polymer layer takes place such that at least part of the polymer layer, which is preferably made of PDMS, undergoes a glass transition. In this connection the cooling can be cooling to below −100° C. which can be brought about e.g. by means of liquid nitrogen. This embodiment is advantageous because the polymer layer contracts depending on the temperature change and/or undergoes a glass transition, and transfers the forces thus produced to the solid body, by means of which mechanical stresses can be generated in the solid body which lead to the initiation of a crack and/or crack propagation, the crack first of all propagating along the first detachment plane in order to split off the layer of solid material.

According to one preferred embodiment of the present invention the solid body is disposed on a holding layer for holding the solid body, the holding layer being disposed on a first level surface portion of the solid body, the first level surface portion of the solid body being spaced apart from a second level surface portion of the solid body, the polymer layer being disposed on the second level surface portion, and the detachment plane being aligned parallel to the first level surface portion and/or to the second level surface portion or being generated in parallel.

This embodiment is advantageous because the solid body is disposed at least partially and preferably entirely between the holding layer and the polymer layer, by means of which the stresses for generating cracks or propagating cracks can be introduced into the solid body by means of one of these layers or by means of both of the layers.

According to another preferred embodiment of the present invention at least or precisely one radiation source for providing the radiation to be introduced into the solid body is configured such that the rays irradiated by it generate the defects at predetermined locations within the solid body. This embodiment is advantageous because by means of a radiation source, in particular by means of a laser, one can generate defects in the solid body with extreme precision.

In particular, there are two applications for the method, in the following called "wafering" and "thinning". With "wafering" the method is generally used to detach a thick layer from an even thicker semiconductor block, typically a wafer (with the industry-specific thicknesses) from an ingot. With "thinning" the method is used to split off a very thin layer from a wafer, and this corresponds to today's grinding process, but with the advantage that the material that is not required remains intact and can be reused. It is complicated to make a clear separation between "thinning" and "wafering" because e.g. the "thinning" can also take place by acting on the rear side of a wafer so that a thin layer is produced, but the laser penetrates deeply into the material.

For the case of "thinning":

According to another preferred embodiment of the present invention the radiation source is set up such that the rays irradiated by it in order to generate the detachment plane penetrate into the solid body to a defined depth, in particular <100 µm. Preferably, the detachment plane is formed in parallel, spaced apart from an outer and preferably level surface of the solid body. Preferably, the detachment plane is less than 100 micrometres and preferably less than 50 micrometres and particularly preferably less than or precisely 20, 10, 5 or 2 micrometres away from the level surface of the solid body within the solid body. Therefore, the detachment plane is preferably made in the form of a plane generated from defects, the defects being formed spaced apart by less than 100 micrometres and preferably by less than 50 micrometres and particularly preferably by less than 20, 10 or 2 micrometres from the level surface of the solid body within the solid body.

For the case of "wafering":

According to another preferred embodiment of the present invention the radiation source is set up such the rays irradiated by it in order to generate the detachment plane penetrate into the solid body to a defined depth, in particular >100 μm. Preferably, the detachment plane is formed in parallel, spaced apart from an outer and preferably level surface of the solid body. Preferably, the detachment plane is formed spaced apart by more than 100 micrometres and preferably by more than 200 micrometres and particularly preferably by more than 400 or 700 micrometres from the level surface of the solid body within the solid body. Therefore, the detachment plane is preferably made in the form of a plane generated by defects, the defects being formed spaced apart by more than 100 micrometres and preferably by more than 200 micrometres and particularly preferably by more than 400 or 700 micrometres from the level surface of the solid body within the solid body.

According to another preferred embodiment of the present invention the solid body is exposed to a predetermined wavelength and/or output, the predetermined wavelength preferably being adapted to the respective material or substrate. This embodiment is advantageous because the size of the defect can be influenced by the wavelength and/or the output.

According to another preferred embodiment of the present invention the solid body comprises silicon and/or gallium or perovskite, and the polymer layer and/or the holding layer are made at least partially, and preferably entirely, or by more than 75% of polydimethylsiloxane (PDMS), the holding layer being disposed on an at least partially level surface of a stabilisation device which is made at least partially of at least one metal. The stabilisation device is preferably a plate, in particular a plate that comprises aluminium or is made of the latter. This embodiment is advantageous because by means of the stabilisation device and the holding layer the solid body is defined or held securely, by means of which the stresses can be generated very precisely in the solid body.

According to another preferred embodiment of the present invention the stresses in the solid body can be set up or generated such that the crack initiation and/or the crack propagation can be controlled in order to generate a topography of the surface that is produced in the crack plane. Therefore, the stresses can preferably be generated in different regions of the solid body such as to be of different strengths, at least from time to time. This embodiment is advantageous because by controlling the crack initiation and/or the crack development, the topography of the layer of solid material that is generated or separated can advantageously be influenced.

According to another preferred embodiment of the present invention the defects determine at least one crack directing layer, the at least one crack directing layer being of a form different from a level form. This solution is advantageous because the layers of solid material generated or the solid bodies generated can have a form different from a level layer. Therefore, no longer are only level layers formed or generated, but also three-dimensional bodies, from a workpiece by means of crack propagation. On the basis of the production method solid bodies produced in this way have a very advantageous surface that only needs to be reworked to a small extent or not at all. Thus e.g. optical elements, such as e.g. a prism or a lens can be produced in a one-stage or multi-stage, in particular two- or three-stage splitting process.

Therefore, according to a preferred embodiment of the present invention the form of the crack directing layer has at least partially the contour of a three-dimensional object, in particular of a lens or a prism.

According to one preferred embodiment of the present invention the defects are generated by means of a defect generation apparatus or the radiation source, the defect generation apparatus being configured such that the defects are generated in the workpiece a constant distance away from the defect generation apparatus, the workpiece and the defect generation apparatus being inclined relative to one another such that the defects generated by the defect generation apparatus are generated in the crack directing layer, the defect generation apparatus and the workpiece only being re-positioned two-dimensionally in relation to one another during the defect generation. The defect generation apparatus is therefore preferably re-positioned in relation to the workpiece, or the workpiece is re-positioned in relation to the defect generation apparatus, or the defect generation apparatus and the workpiece are both re-positioned in relation to one another.

This embodiment is advantageous because the radiation source or the defect generation device need only be repositioned in order to generate defects, and no modification needs to be made to the defect generation apparatus, and in particular no changed defect introduction depth needs to be determined or set.

According to another preferred embodiment the defects are generated by means of a defect generation apparatus or the radiation source, the defect generation apparatus being configured such that the defects are generated in the workpiece a distance away from the defect generation apparatus that changes from time to time, a modification of the defect generation apparatus being brought about at least from time to time depending on the distance between the defect generation apparatus and the defect to be generated, in particular a changed defect introduction depth being determined and set up. This embodiment is advantageous because preferably, no incline apparatus need be provided in order to incline the workpiece.

The solid body preferably comprises a material or a material combination of one of the main groups 3, 4 and 5 of the periodic table of the elements, such as e.g. Si, SiC, SiGe, Ge, GaAs, InP, GaN, $Al_2O_3$ (sapphire), AlN. Particularly preferably, the solid body has a combination of elements occurring in the third and the fifth group of the periodic table. Conceivable materials or material combinations here are e.g. gallium arsenide, silicon, silicon carbide etc. Furthermore, the solid body can comprise a ceramic (e.g. $Al_2O_3$-aluminium oxide) or be made of a ceramic, preferred ceramics here being e.g. perovskite ceramics (such as e.g. ceramics containing Pb, O, Ti/Zr) in general and lead magnesium niobates, barium titanate, lithium titanate, yttrium aluminium garnet, in particular yttrium aluminium garnet crystals for solid body laser applications, SAW (Surface Acoustic Wave) ceramics, such as e.g. lithium niobate, gallium orthophosphate, quartz, calcium titanate, etc. in particular. Therefore, the solid body preferably comprises a semiconductor material or a ceramic material, or particularly preferably the solid body is made of at least one semiconductor material or a ceramic material. Furthermore, it is conceivable for the solid body to comprise a transparent material or to be made of or to be produced partially from a transparent material such as e.g. sapphire. Additional materials that can be considered as a solid material here on their own or in combination with another material are e.g.

"wide band gap" materials, InAlSb, high temperature superconductors, in particular rare earth cuprates (e.g. YBa2Cu3O7).

According to another preferred embodiment of the present invention the radiation source or part of the radiation source is in the form of a femtosecond laser (fs laser). This solution is advantageous because by using an fs laser the vertical propagation of the defective material is minimised. By using an fs laser it is possible to introduce defects in the workpiece very precisely and to generate them in the latter. The wavelength and/or the energy of the fs laser are preferably to be chosen dependently upon the material.

According to another preferred embodiment of the present invention the energy of the radiation source, in particular of the laser beam, in particular of the fs laser, is chosen such that the damage propagation within the solid body or within the crystal is smaller than three times the Rayleigh length, preferably smaller than the Rayleigh length and particularly preferably smaller than one third of the Rayleigh length.

The wavelength of the laser beam, in particular of the fs laser, is chosen according to another preferred embodiment of the present invention such that the absorption of the solid body or of the material is less than 10 $cm^{-1}$ and preferably less than 1 $cm^{-1}$ and particularly preferably less than 0.1 $cm^{-1}$.

According to another preferred embodiment of the present invention the individual defects respectively result from multiphoton excitation brought about by the radiation source, in particular the laser, in particular an fs laser.

Furthermore, the invention relates to a wafer that is produced by a method according to any of Claims 1 to 12.

Furthermore, the subject matter of publications PCT/US2008/012140 and PCT/EP2009/067539 is made complete by referring to the subject matter of the present patent application. Likewise, the subject matter of all of the other patent applications also submitted by the applicant on the application date of the present patent application and relating to the domain of the production of layers of solid material are in their entirety included in the subject matter of the present patent application.

Other advantages, aims and properties of the present invention are explained by means of the following description of the attached drawings in which the wafer production according to the invention is shown as an example. Components or elements of the wafer production according to the invention which in the figures correspond, at least substantially with regard to their function, can be identified here by the same reference signs, these components or elements not having to be numbered or explained in all of the figures.

Individual or all of the illustrations of the figures described below are preferably to be considered as design drawings, i.e. the dimensions, proportions, functional relationships and/or arrangements shown by the figure or figures preferably correspond precisely or preferably substantially to those of the apparatus according to the invention or of the product according to the invention.

The figures show as follows:

FIG. 3a diagrammatic illustration of the detachment plane.

Figure 1A:
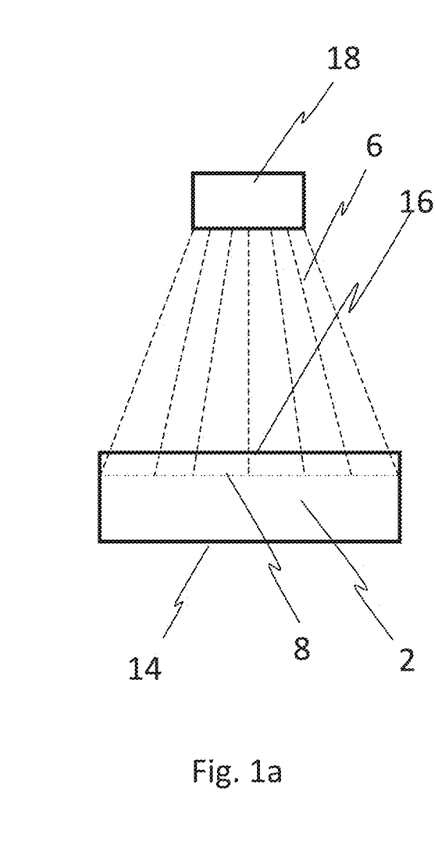
FIG. 1a a diagrammatic construction for generating defects in a solid body.

FIG. 1a shows a solid body 2 or a substrate that is disposed in the region of a radiation source 18, in particular a laser. The solid body 2 preferably has a first level surface portion 14 and a second level surface portion 16, the first level surface portion 14 preferably being aligned substantially or exactly parallel to the second level surface portion 16. The first level surface portion 14 and the second level surface portion 16 preferably delimit the solid body 2 in a Y direction that is preferably aligned vertically or perpendicularly. The level surface portions 14 and 16 preferably extend respectively in an X-Z plane, the X-Z plane preferably being aligned horizontally. Furthermore, it can be gathered from this illustration that the radiation source 18 irradiates rays 6 onto the solid body 2. The rays 6 penetrate by a defined depth into the solid body 2 depending on the configuration and generate a defect at the respective position or at a predetermined position.

Figure 1B:
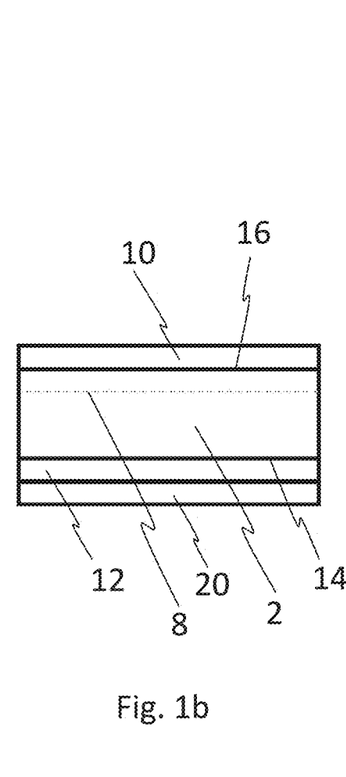
FIG. 1b a diagrammatic illustration of a layer arrangement before separating a layer of solid material from a solid body.

FIG. 1b shows a multi-layered arrangement, the solid body 2 containing the detachment plane 8 and being provided in the region of the first level surface portion 14 with a holding layer 12 which is in turn preferably overlaid by an additional layer 20, the additional layer 20 preferably being a stabilisation device, in particular a metal plate. A polymer layer 10 is preferably disposed on the second level surface portion 16 of the solid body 2. The polymer layer 10 and/or the holding layer 12 are preferably made at least partially and particularly preferably entirely of PDMS.

Figure 1C:
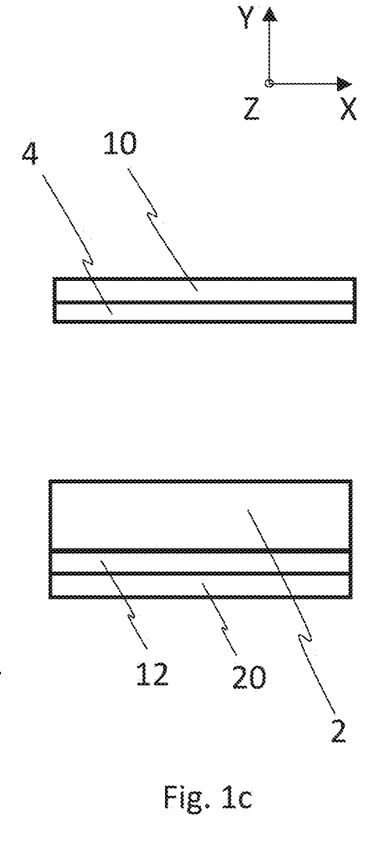
FIG. 1c a diagrammatic illustration of a layer arrangement after separating a layer of solid material from a solid body.

FIG. 1c shows a state after a crack initiation and subsequent crack directing. The layer of solid material 4 adheres to the polymer layer 10 and is or can be spaced apart from the remaining part of the solid body 2.

Figure 2A:
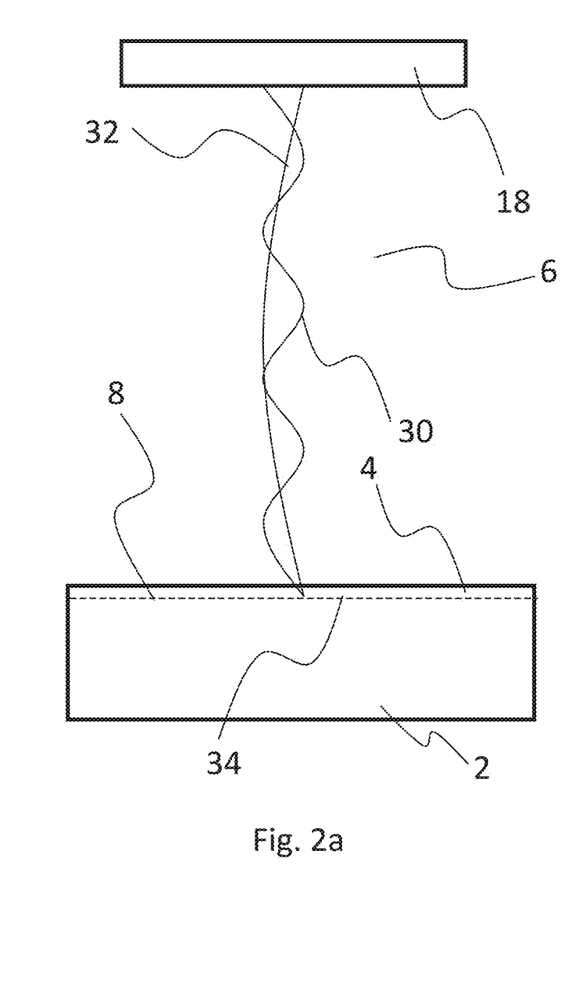
FIG. 2a a first diagrammatically illustrated variation for generating defects by means of light waves.
Figure 2B:
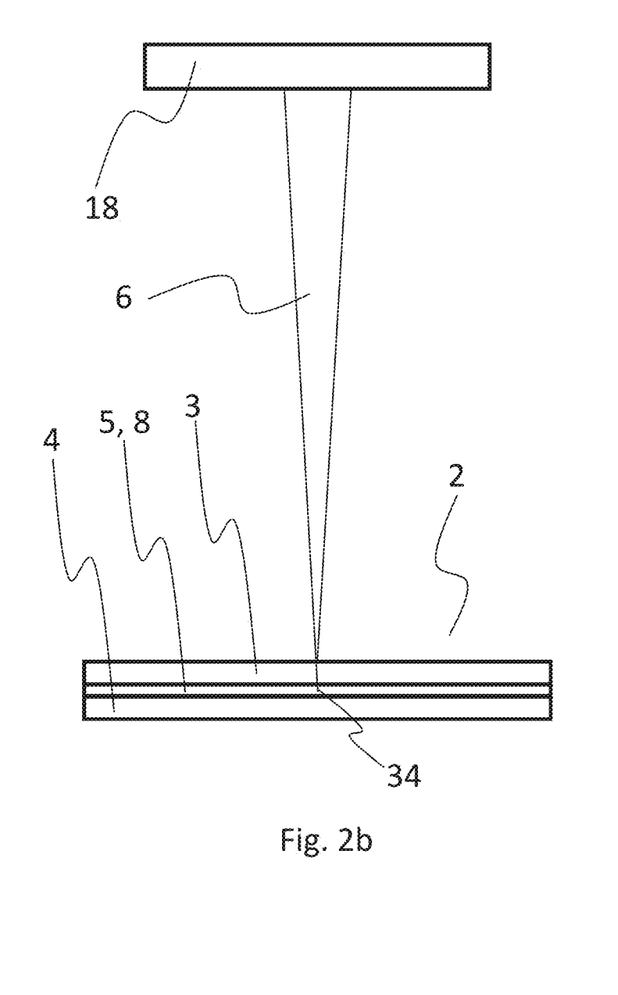
FIG. 2b a second diagrammatically illustrated variation for generating defects by means of light waves.

FIGS. 2a and 2b show examples of the generation, shown in FIG. 1a, of a detachment plane 8 by introducing defects into a solid body 2 by means of light rays.

Therefore, the present invention relates to a method for the production of layers of solid material. This method according to the invention includes at the very least the steps of providing a solid body 2 for the separation of at least one layer of solid material 4, generating defects by means of at least one radiation source, in particular at least one laser, in particular at least one fs laser, in the inner structure of the solid body in order to determine a detachment plane along which the layer of solid material is separated from the solid body, and applying heat to a polymer layer 10 disposed on the solid body 2 in order to generate, in particular mechanically, stresses in the solid body 2, due to the stresses a crack propagating in the solid body 2 along the detachment plane 8, which crack separates the layer of solid material 4 from the solid body 2.

Therefore, FIG. 2a shows diagrammatically how defects 34 can be generated in a solid body 2, in particular in order to generate a detachment plane 8 by means of a radiation source 18, in particular one or more lasers, in particular one or more fs lasers. Here the radiation source 18 emits radiation 6 with a first wavelength 30 and a second wavelength 32. The wavelengths 30, 32 are matched to one another here or the distance between the radiation source 18 and the detachment plane 8 to be generated is matched such that the waves 30, 32 converge substantially or precisely on the detachment plane 8 in the solid body 2, by means of which a defect is generated at the point of coinciding 34 as a result of the energies of the two waves 30, 32. The generation of defects can take place here by means of different or combined decomposition mechanisms such as e.g. sublimation or chemical reaction, the decomposition being able to be initiated here e.g. thermally and/or photochemically.

FIG. 2b shows a focussed light ray 6, the focal point of which preferably lies in the detachment plane 8. It is conceivable here for the light ray 6 to be focussed by one or more focussing bodies, in particular a lens/lenses (not shown). In this embodiment the solid body 2 is multi-layered in form and preferably has a partially transparent or transparent substrate layer 3 or material layer that is preferably made of sapphire or comprises sapphire. The light rays 6 pass through the substrate layer 3 onto the detachment plane 8 which is preferably formed by a sacrificial layer 5, the sacrificial layer 5 being exposed to radiation such that partial or complete destruction of the sacrificial layer 5 is brought about thermally and/or photochemically in the focal point or in the region of the focal point. It is also conceivable for the defects for the generation of the detachment layer 8 to be generated in the region of or precisely on a boundary surface between two layers 3, 4. It is therefore also conceivable for the layer of solid material 4 to be generated on a support layer, in particular a substrate layer 3, and for a detachment plane 8 for the detachment or separation of the layer of solid material 4 to be able to be generated by means of one or more sacrificial layers 5 and/or or by means of the generation of defects in a boundary surface, in particular between the layer of solid material 4 and the support layer.

Figure 3:
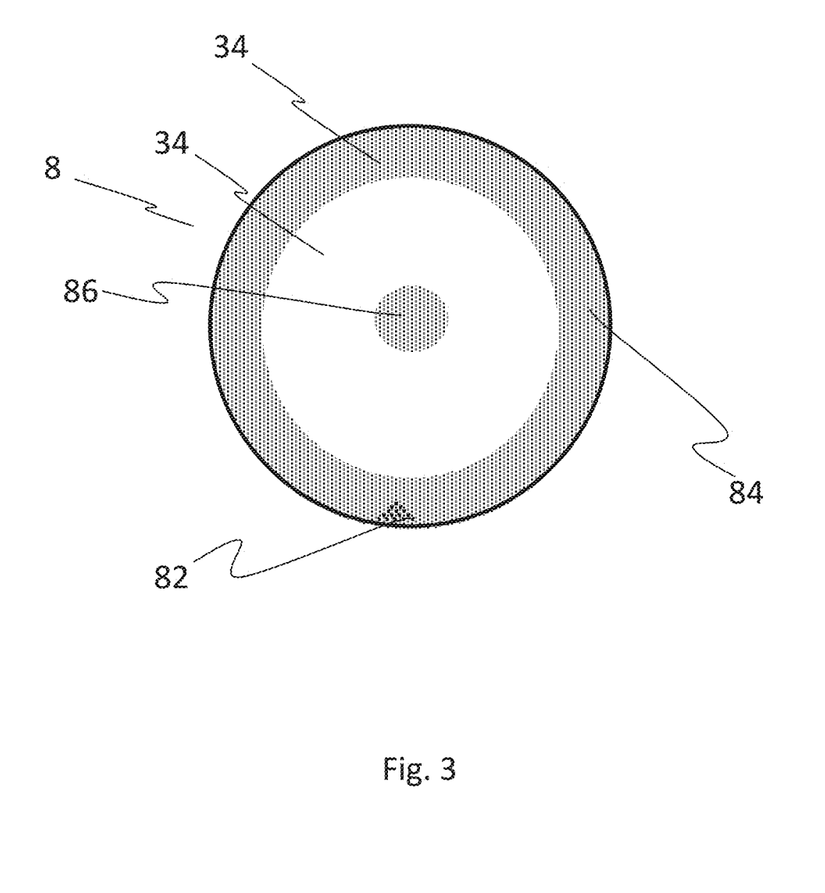

FIG. 3 shows a detachment plane 8 which has regions with different concentrations of defects 82, 84, 86. It is conceivable here for a plurality or regions with different concentrations of defects to form a detachment plane 8, it also being conceivable for the defects 34 in the detachment plane 8 to be distributed substantially or exactly evenly over the surface. The different concentrations of defects per area can be of the same level or of different levels. Preferably, a first increased concentration of defects constitutes a crack initiation concentration 82 which is preferably generated in the region of the edge or extending towards the edge or adjacent to the edge. In addition or alternatively, a crack directing concentration 84 can be formed such that the crack separating the layer of solid material 4 from the solid body 2 can be controlled or regulated. Furthermore, in addition or alternatively, a concentration at the centre 86 is generated which preferably makes a very level surface possible in the region of the centre of the solid body 2. Preferably, the crack directing concentration 84 is made to be partially or entirely annular or encircling, and so preferably partially and particularly preferably entirely encircles the centre of the solid body 2 or the layer of solid material 4. Furthermore, it is conceivable for the crack directing concentration 84 to decrease step by step, constantly or fluently in a direction passing from the edge of the solid body 2 and towards the centre of the solid body 2. Furthermore, it is conceivable for the crack directing concentration 84 to be formed in bands and homogeneously or substantially or exactly homogeneously.

Therefore, the method according to the invention preferably includes the following steps:

Providing a workpiece for the detachment of at least one layer of solid material and/or at least one solid body, the workpiece having at least one exposed surface, generating defects within the workpiece by means of a radiation source, in particular a laser, in particular an fs laser, or a defect generation apparatus, the defects determining a crack directing layer, applying or generating a receiving layer on the exposed surface of the workpiece such as to form a composite structure, tempering the receiving layer in order to generate stresses within the workpiece, the stresses bringing about crack propagation within the workpiece, by means of the crack propagation a layer of solid material being separated from the workpiece along the crack directing layer.

LIST OF REFERENCE SIGNS 2 solid body
3 substrate
4 layer of solid material
5 sacrificial layer
6 radiation
8 detachment plane
10 polymer layer
12 holding layer
14 first level surface portion
16 second level surface portion
18 radiation source
20 stabilisation device
30 first radiation portion
32 second radiation portion
34 location of the defect generation
82 crack initiation concentration
84 crack directing concentration
86 concentration at the centre
X first direction
Y second direction
Z third direction

The invention claimed is:

1. A method for the production of layers of solid material comprising:
   providing a solid body for the separation of at least one layer of solid material, the solid body having a first level surface portion and a second level surface portion, wherein the second level surface is part of the layer of solid material, wherein the layer of solid material is thinner than the remaining part of the solid body, wherein the first level surface and the second level surface are opposing main surfaces of said solid material;
   then generating defects by means of laser beams of multiphoton excitation caused by at least one laser acting in the inner structure of the solid body in order to determine a detachment plane along which the layer of solid material is to be separated from the solid body, the laser beams penetrating into the solid body via the second level surface portion;
   then providing a receiving layer for holding the layer of solid material on the solid body, the receiving layer being disposed on the second level surface portion and the receiving layer being in the form of a polymer layer;
   then subjecting the receiving layer to temperature conditions in order to generate mechanical stresses in the solid body, including cooling of the receiving layer to a temperature below ambient temperature, the cooling taking place such that at least part of the polymer layer undergoes a glass transition and due to stresses a crack propagates in the solid body along the detachment plane, which crack separates the layer of solid material from the solid body, and
   wherein the defects are generated in different concentrations in the detachment plane.

2. The method of claim 1 further comprising at least one radiation source for providing the radiation to be introduced into the solid body being configured such that the rays irradiated by it generate the defects at predetermined locations within the solid body.

3. The method of claim 2 further comprising the radiation source being set up such that the rays irradiated by the radiation source generate the detachment plane penetrate into the solid body to a defined depth of less than 200 μm.

4. The method of claim 2 further comprising the radiation source being set up such that the rays irradiated by the radiation source to generate the detachment plane penetrate into the solid body to a defined depth of more than 100 μm.

5. The method of claim 2 further comprising the radiation source being a femtosecond laser.

6. The method of claim 5 further comprising energy of the femtosecond laser being chosen such that the damage propagation within the solid body is smaller than 3 times the Rayleigh length.

7. The method of claim 5 further comprising the wavelength of the femtosecond laser being chosen such that the absorption of the solid body is less than 10 $cm^{-1}$.

8. The method of claim 5 further comprising the defects respectively resulting from multiphoton excitation brought about by the femtosecond laser.

9. The method of claim 2 further comprising the radiation source having a pulse duration of less than 10 ps.

10. The method of claim 1 further comprising the solid body being disposed on a holding layer for holding the solid body, the holding layer being disposed on the first level surface portion of the solid body, the first level surface portion of the solid body being spaced apart from the second level surface portion of the solid body, the detachment plane being aligned parallel to the first level surface portion and/or the second level surface portion.

11. The method of claim 1 further comprising the solid body including silicon carbide and/or gallium arsenite and/or a ceramic material and the polymer layer, the polymer layer and/or a holding layer being made at least partially of PDMS, the holding layer being disposed on an at least partially level surface of a stabilisation device which is made at least partially of at least one metal.

12. The method of claim 1 further comprising the stresses in the solid body being set up such that the crack initiation and/or the crack propagation can be controlled in order to generate a pre-determined topography of the surface that is produced in the crack plane.

13. The method of claim 1 further comprising the solid body being a semiconductor material or a ceramic material.

14. The method of claim 1 further comprising the solid body being made of at least one semiconductor material or a ceramic material.

15. A method for the production of layers of solid material comprising:
at a first instance in time, providing a solid body for the separation of at least one layer of solid material, the solid body having a first level surface portion and a second level surface portion, wherein the second level surface is part of the layer of solid material, wherein the layer of solid material is thinner than the remaining part of the solid body, wherein the first level surface and the second level surface are opposing main surfaces of said solid material;
thereafter at a second instance in time occurring after the first instance, generating defects in the solid body with at least one laser producing laser beams of multiphoton within the inner structure of the solid body to produce a detachment plane along which the layer of solid material is to be separated from the solid body, the laser beams penetrating into the solid body via the second level surface portion;
thereafter at a third instance in time occurring after the second instance, providing a receiving layer for holding the layer of solid material on the solid body, the receiving layer being disposed on the second level surface portion and the receiving layer being in the form of a polymer layer;
thereafter at a fourth instance in time occurring after the second instance, subjecting the receiving layer to temperature conditions in order to generate mechanical stresses in the solid body, including cooling of the receiving layer to a temperature below ambient temperature, the cooling taking place such that at least part of the polymer layer undergoes a glass transition and a crack propagates in the solid body along the detachment plane due to stresses, the crack separating the layer of solid material from the solid body, and
wherein the defects are generated in different concentrations in the detachment plane.

* * * * *

UNITED STATES PATENT AND TRADEMARK OFFICE
CERTIFICATE OF CORRECTION

PATENT NO. : 10,593,590 B2
APPLICATION NO. : 16/378902
DATED : March 17, 2020
INVENTOR(S) : W. Drescher et al.

Page 1 of 1

It is certified that error appears in the above-identified patent and that said Letters Patent is hereby corrected as shown below:

On the Title Page

Page 2/Foreign Pat. Docs. (Line 13), please change "2013/26927" to -- 2013/126927 --.

Signed and Sealed this
Nineteenth Day of May, 2020

Andrei Iancu
*Director of the United States Patent and Trademark Office*